(12) United States Patent
Gehrels et al.

(10) Patent No.: US 9,442,184 B2
(45) Date of Patent: Sep. 13, 2016

(54) FUNCTIONAL SAFETY MONITOR PIN

(71) Applicant: NXP B.V., Eindhoven (NL)

(72) Inventors: Cornelis Gehrels, Nijmegen (NL);
Cicero Silveira Vaucher, Eindhoven (NL); Luc Van Dijk, Nijmegen (NL)

(73) Assignee: NXP B.V., Eindhoven (NL)

( * ) Notice: Subject to any disclaimer, the term of this patent is extended or adjusted under 35 U.S.C. 154(b) by 366 days.

(21) Appl. No.: 14/186,158

(22) Filed: Feb. 21, 2014

(65) Prior Publication Data
US 2015/0241553 A1 Aug. 27, 2015

(51) Int. Cl.
*G01S 7/40* (2006.01)
*G01R 31/00* (2006.01)

(52) U.S. Cl.
CPC ........... *G01S 7/4004* (2013.01); *G01R 31/005* (2013.01); *G01S 7/40* (2013.01)

(58) Field of Classification Search
CPC ...... G01S 7/4004; G01S 7/40; G01R 31/005
USPC ................................................. 342/173–175
See application file for complete search history.

(56) References Cited

U.S. PATENT DOCUMENTS

| | | | | |
|---|---|---|---|---|
| 4,250,454 A * | 2/1981 | Sakamoto | ............... | G01R 25/08 327/241 |
| 6,586,924 B1 * | 7/2003 | Okayasu | ............ | G01R 31/3191 324/532 |
| 7,002,328 B2 * | 2/2006 | Kernahan | ............. | H02M 3/157 323/283 |
| 7,019,506 B2 * | 3/2006 | Kernahan | ............. | H02M 3/157 323/284 |
| 8,009,084 B1 * | 8/2011 | Frisbee, Jr. | ........... | G01S 7/4052 342/165 |
| 9,087,164 B2 * | 7/2015 | Perry | ...................... | G06F 17/50 |
| 9,311,486 B2 * | 4/2016 | Ayanam | ................ | G06F 21/572 |
| 9,331,866 B2 * | 5/2016 | van Dijk | ............... | H04L 12/403 |
| 9,368,958 B2 * | 6/2016 | Ferrara | ..................... | H02H 5/04 |
| 9,383,433 B2 * | 7/2016 | Doyle | ................... | G01S 7/4004 |
| 2005/0083024 A1 * | 4/2005 | Harris | ................ | H02M 3/1584 323/282 |
| 2005/0237163 A1 * | 10/2005 | Lee | .................... | G06K 19/0723 340/10.51 |
| 2009/0051427 A1 * | 2/2009 | Miyashita | ................. | H03F 1/52 330/251 |
| 2010/0141225 A1 * | 6/2010 | Isham | ................... | H02M 3/156 323/282 |
| 2014/0333276 A1 * | 11/2014 | Arno | ................. | H02M 3/33569 323/282 |
| 2015/0236585 A1 * | 8/2015 | Grandy | ................... | H02M 1/44 323/282 |
| 2015/0241553 A1 * | 8/2015 | Gehrels | .................... | G01S 7/40 342/173 |

FOREIGN PATENT DOCUMENTS

| | | | |
|---|---|---|---|
| EP | 2 072 366 A1 | 6/2009 | |
| EP | 2 876 016 A1 | 5/2015 | |
| NL | EP 2911027 A2 * | 8/2015 | ............... G01S 7/40 |

OTHER PUBLICATIONS

IEEE Standard for Reduced-Pin and Enhanced-Functionality Test Access Port and Boundary-Scan Architecture, in IEEE Std 1149.7-2009 , vol., No., pp. 1-985, Feb. 10, 2010.*
Extended European Search Report for Patent Appln. No. 15155597.6 (Aug. 5, 2015).

* cited by examiner

*Primary Examiner* — John B Sotomayor

(57) ABSTRACT

A radar data processing system is disclosed. The system includes a microcontroller and a data receiver-transmitter integrated circuit coupled to the microcontroller. The data receiver-transmitter integrated circuit includes a sensor and a dedicated error indicator pin. The data receiver-transmitter integrated circuit includes an inner safety monitor and the microcontroller includes an outer safety monitor. The inner safety monitor configured to receive and collate sensor data from the plurality of sensors and send, through the dedicated error indicator pin, a function warning signal to the outer safety monitor when the sensor data from the sensor is indicative of a functional irregularity.

20 Claims, 5 Drawing Sheets

FUNCTIONAL SAFETY MONITOR PIN

BACKGROUND

In mission critical applications, it is important to ensure that components of a system are functioning properly and to provide quick notification to other sub-systems or components when an irregularity in functioning arises. Among many, one exemplary mission critical application is Active Driver Assistance System.

Active driver assistance systems such as radar-assisted Autonomous Emergency Braking (AEB) are expected to increase market penetration significantly in the 2015-2020 timeframe, triggered among other things by a decreased cost of ownership of mmWave automotive radar sensors operating in the 76-81 GHz frequency band.

Active safety systems such as AEB, on the other hand, need to comply with stringent levels of functional safety, for example as defined in the ISO 26262 standard. "ISO 26262 defines functional safety for automotive equipment applicable throughout the lifecycle of all automotive electronic and electrical safety-related systems. ISO 26262 is risk-based safety standard, where the risk of hazardous operational situations are qualitatively assessed and safety measures are defined to avoid or control systematic failures, and to detect or control random hardware failures, or mitigate their effects."

In the context of a radar sensor, an ISO26262 compliant-product shall detect functional errors and flag the error condition to a central controller (from which, e.g. brake-actuators are activated, under normal operation conditions). The central controller will then disregards messages from the radar sensor until a "reset" condition takes place within the radar sensor, and the error condition is satisfactorily removed.

With this safety set-up, and in the context of an AEB system as mentioned above, undesirable and dangerous braking actions from a vehicle which would be generated as a consequence of a functional error condition within the sensor are not allowed to happen.

Looking more specifically into radar sensors and their active front-end circuitry operating at micro wave and mmWave frequencies, a number of functional tests include monitoring for over-temperature operating conditions, monitoring on the presence of local oscillator signals at the RX mixers and on the output of the power amplifiers, and so on.

SUMMARY

Systems that provide certain services, such as safety critical services, may be monitored by one or more data processing systems. The data processing systems are used to check that component parts or processes with the system are operating within predetermined limits. Ensuring that the component parts/processes are functioning correctly can make the overall system more reliable. According to one or more aspects of the present disclosure, dedicated pin or pins may be provided to quickly provide indication if the system inside an integrated circuit or system board is functioning properly. As for example, safety checks are performed routinely and if an error is found, the status of a dedicated error indicator pin is changed.

Even though embodiments described herein may be used in many types of mission critical applications, to provide better understanding, advanced driver assistance systems, such as an Automatic Emergency Braking (AEB) system is being used as an example. An AEB system provides the service of detecting whether a vehicle is likely to collide with another object and can apply the brakes to avoid or reduce the damage incurred in the collision. An AEB system typically uses a radar assembly comprising an RF transmitter and receiver to measure the distance between the vehicle and an object and uses the closing speed between the vehicle and object to determine if the brakes should be automatically actuated. The correct operation of such a system is important given that the system can intervene in the control of the vehicle. The data processing system can therefore ensure that component parts (such as transmitters, receivers, oscillators, electronic components) are operating correctly, as well as processes (such as calculations and signal processing processes) are generating appropriate values on which the service provided by the system makes decisions. The functional safety of such systems forms part of established standards, such as ISO 26262.

According to one aspect, an integrated circuit is disclosed. The integrated circuit includes an error monitor and an error sensor coupled to the error monitor. The integrated circuit also includes a dedicate error indicator pin coupled to the error monitor. The error monitor is configured to determine an error condition through the error sensor and set the status of the dedicated error indicator pin to indicate an error. The integrated circuit may further include a dedicate error reset pin coupled to the error monitor and a dedicated operation pin that is configured to be used to reset an error condition. The integrated circuit may include a dedicated operation pin that is configured to cause the integrated circuit to perform a preset operation.

In one example, the integrated circuit may also include a function module for processing radar data. The dedicated operation pin is configured to power down radio frequency operations. In one aspect, the integrated circuit is configured to continue to keep the status of the dedicated error indicator pin to indicate the error even when the error no longer persists until an external system resets the error via the dedicated error reset pin.

According to another aspect of the disclosure, a radar data processing system is disclosed. The radar data processing system includes a microcontroller and a data receiver-transmitter integrated circuit coupled to the microcontroller. The data receiver-transmitter integrated circuit including a sensor and a dedicated error indicator pin. The data receiver-transmitter integrated circuit includes an inner safety monitor and the microcontroller includes an outer safety monitor. The inner safety monitor is configured to receive and collate sensor data from the sensor and send, through the dedicated error indicator pin, a function warning signal to the outer safety monitor when the sensor data from the sensor is indicative of a functional irregularity. The function warning signal comprises an interrupt. The microcontroller is configured to execute an operation upon receiving the interrupt.

The inner safety monitor is dedicated to monitoring for functional irregularities and the outer safety monitor is configured to additionally process data for providing a service of the radar data processing system. The inner safety monitor stores identifying details of function irregularities in a memory. The sensor comprises at least one or more of:
  i) a temperature sensor;
  ii) a RF connection break;
  iii) an oscillator fault detector;
  iv) clock fault sensor; and
  v) voltage level sensor.

In one example, the inner safety monitor comprises a state machine. Each sensor includes an irregularity detecting arrangement including a trigger having an irregularity detected state and a no irregularity detected state. The trigger is configured to adopt the irregularity detected state when the arrangement detects that a measurement value is outside of a predetermined threshold. The sensor data comprises a signal that indicates the state of the irregularity detecting arrangement.

In one aspect, in response to receiving a function warning signal, the outer safety monitor is configured to selectively provide a reset signal to said inner safety monitor and, in response to receiving the reset signal, the inner safety monitor is configured to reset the sensor that caused it to generate the function warning signal. In response to receiving a function warning signal, the outer safety monitor is configured to selectively provide a power down signal to said inner safety monitor and, in response to receiving the power down signal, the inner safety monitor is configured to provide instructions to power down the system or at least a part of the system such as RF functions.

In one or more embodiments, the communication between the inner safety monitor and outer safety monitor is provided by three hardware lines comprising a function irregularity reporting line for providing the function warning signal to the outer safety monitor, a reset sensor line for providing a reset signal to the inner safety monitor for resetting a detected function irregularity and a power down line for providing a power down signal to the inner safety monitor to deactivate the system or at least a part of the system functions such as RF module or modules. The first data processing system receives a separate power supply to the outer safety monitor. The outer safety monitor is configured to selectively send an irregularity enquiry request to said inner safety monitor and, in response to said request, the inner safety monitor is configured to report the status of one or more of the sensors.

The embodiments described here may also be used to enable the system to provide a service, such as Automatic Emergency Braking, to a user. This is advantageous as the inner safety monitor can act as a central reporting element for the sensors and inform the outer safety monitor when a function irregularity is detected. The outer safety monitor can therefore manage the function irregularities rather than having to detect and read information from the sensors.

The outer safety monitor may comprise a digital signal processor (DSP) or microcontroller. The DSP or microcontroller may be configured to process data for providing a service of the system. Alternatively or additionally, the digital signal processor or microcontroller may be configured to perform signal processing on processes involved in providing the service of the system for the purpose of detecting function irregularities. For example, the microcontroller or DSP may be configured to determine irregularities in baseband signal amplitude, baseband signal phase, baseband noise level, ADC clipping, digital signal circuitry, transmit signal amplitude and/or phase noise level in data received from a radar assembly of the system.

Thus, the microcontroller or digital signal processor may be configured to process radar signals in addition to managing function irregularities received from the inner safety monitor. The system may comprise an autonomous emergency braking system.

The outer safety monitor may be configured to selectively send an irregularity enquiry request to said inner safety monitor and, in response to said request, the inner safety monitor is configured to report the status of one or more of the sensors. The irregularity enquiry request may be sent by a Serial Peripheral Interface (SPI) and the status may be reported from an SPI read register of the inner safety monitor.

The inner and outer safety monitors may be configured to monitor a plurality of parameters associated with the system for detecting function irregularities in the operation of the system, a first subset of the parameters configured to be monitored by the inner safety monitor and a different, second subset of the parameters configured to be monitored by the outer safety monitor, wherein the first subset comprises at least one parameter configured to be compared with a threshold value and the second subset comprises at least one parameter requiring signal processing, such as Fourier analysis, to determine if it is indicative of a function irregularity.

BRIEF DESCRIPTION OF DRAWINGS

There now follows, by way of example only, a detailed description of embodiments of the invention with reference to the following figures, in which.

DETAILED DESCRIPTION

Figure 1:
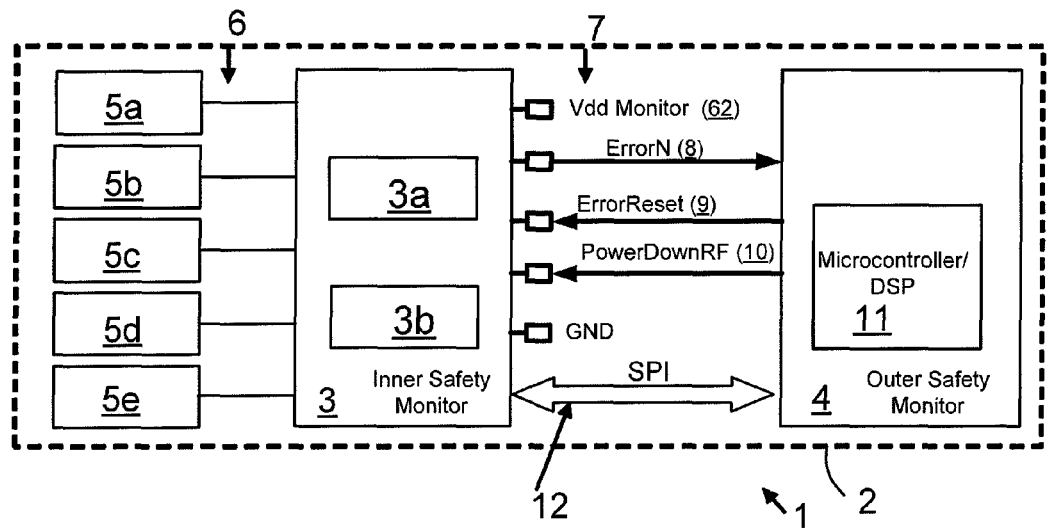
FIG. 1 shows an example embodiment of a data processing system system.

FIG. 1 shows an example embodiment of a data processing system 1 within an advanced driver assistance system 2. In particular, in this example, the advanced driver assistance system (ADAS) comprises an autonomous emergency braking (AEB) system.

The AEB system may utilise a radar assembly comprising a RF transmitter and receiver to measure distances and other parameters between the vehicle in which the system is mounted and other objects. Other advanced driver assistance systems, which are systems that provide assistance to a driver of a vehicle using data about the vehicle and/or the vehicle's surroundings, include radar guided cruise control, lane departure warning system, automatic parking and an automated driving system. It will be appreciated that the invention has other applications in data processing systeming, in vehicle related systems and non-vehicle related systems. The data processing system comprises a safety device that monitors the function of system components to ensure that the system operates safely and reliably. Thus, the data processing system is configured to detect irregularities, such as faults, with components and processes as well as conditions, such as extreme temperatures, that may affect the function of the components.

The data processing system 1 comprises an inner safety monitor 3 and an outer safety monitor 4. The inner safety monitor 3 is configured to receive and collate sensor data from a plurality of sensors 5a-e associated with the advanced driver assistance system 1 and send a function warning signal to said outer safety monitor 4 when the sensor data from one or more of the plurality of sensors 5a-e is indicative of a functional irregularity. In one embodiment, only one sensor 5a is included in the data processing system. This is advantageous as the data processing system 1 is distributed over the system 2 in two parts, which may lead to more reliable performance of the data processing system and the advanced driver assistance system as a whole.

The inner safety monitor 3 comprises a dedicated device configured to receive and collate functional irregularities associated with each of the sensors 5a-e for reporting to the outer safety monitor 4. Identifying details of function irregularities may also be stored in the inner safety monitor 3 for reporting to the outer safety monitor 4. A flag 3a may be used to store the fact that an irregularity has been detected by one or more of the sensors 5a-e and a function irregularity register 3b may used to store the identifying details of the sensor that reported the irregularity. The flag may be provided by a flip-flop to store the receipt of a function irregularity from the sensors. A separate flip flop may be provided for each of the sensors. Alternatively, a single flip flop may act as a flag for irregularities received from any one or more of the sensors and therefore indicate when an irregularity has occurred. The function irregularity register comprises a memory that may comprise a Serial Peripheral Interface read register, for storing details of the irregularities generated by the sensors. In particular, the register typically stores which of the sensors 5a-e has generated a functional irregularity.

The inner safety monitor 3 provides a connection point for all of the sensors 5a-e. The inner safety monitor 3 includes an interface 6 for each of the sensors 5a-e comprising a power supply line 20 for supplying the sensor with power from the element 3, a functionality line 21 for receiving a signal representative of functional irregularities in the system 1 and a reset line 22 for resetting the sensor.

The inner safety monitor 3 also includes an interface 7 with the outer safety monitor 4. This interface may comprise three digital lines; a function irregularity reporting line 8, a reset line 9 and a RF power down line 10. The function irregularity reporting line 8 provides communication from the inner safety monitor 3 to the outer safety monitor 4, and may be a one-way communication line, for informing the outer safety monitor 4 of function irregularities. The reset line 9 allows the inner safety monitor 3 to receive instructions from the outer safety monitor 4 to reset a functional irregularity condition flag 3a. The RF power down line 10 provides for communication from the outer safety monitor 4 to the inner safety monitor 3 for causing the powering down of the AEB system 1, and, in particular, the RF transmitter and receiver components of the AEB system. The inner safety monitor 3 may comprise a "front-end" integrated circuit separate from the outer safety monitor 4, which may comprise a microcontroller. The inner safety monitor 3 may receive a separate power supply 23 to the outer safety monitor 4 and a separate ground connection 24. The element 3 may also have an input connected to a power supply line 62 to be functionally monitored.

The outer safety monitor 4 comprises a microcontroller 11 or, in other embodiments, a digital signal processor. The microcontroller 4 may not be dedicated to data processing system and may perform functions associated with operation of the AEB system 1 and, in addition, handle data processing system through its interface 7 with the inner safety monitor 3. The microcontroller 4 may therefore execute instructions to provide automatic emergency braking using information collected from a RF transmitter and receiver. The sensors 5a-e may be associated with the RF transmitter and receiver to monitor their function and/or environmental conditions. In addition to the interface 7 between the first and outer safety monitors 3, 4, a data collection interface 12 may be provided for exchange of more detailed information regarding the functional irregularities registered by the inner safety monitor 3, such as which sensor 5a-e has generated a functional irregularity signal. The interface 12 may be provided by a Serial Peripheral Interface (SPI) Bus. Operation of such a controller will only be briefly described herein. The second function element comprises a Master SPI controller, which connects to the inner safety monitor 3 by a typical four signal line SPI bus: serial clock (SCL), Master-Out Slave-In (MOSI), Master-In Slave-Out (MISO), and slave select bar (SSn). Data can be written by element 4 into SPI registers in element 3 by means of the MOSI signal, and be read from SPI registers in element 3 by element 4 by means of the MISO signal. Further, the outer safety monitor 4 may also monitor parameters of the system 2 to check for functional irregularities independently of the inner safety monitor 3. For example, the outer safety monitor 4 may be configured to assess for irregularities in system parameters such as baseband signal amplitude, baseband signal phase, baseband noise level, ADC clipping, digital signal circuitry, transmit signal amplitude, phase noise level, MMIC register programming and MMIC register configuration.

Thus, in one embodiment, the first and outer safety monitors share the data processing system safety check duties, with the outer safety monitor 4 managing reports of irregularities from the inner safety monitor 3. The inner safety monitor may comprise a state machine to receive and collate reports of irregularities from a plurality of sensors, said sensors capable of determining if the signal they are measuring is acceptable or irregular, and the outer safety monitor may include a processor for managing (by at least instructing the resetting of the sensor that cause the irregularity or shutting down the system) the function irregularities reported to it by the inner safety monitor as well as performing function irregularity checks independent of the inner safety monitor. The outer safety monitor, due having data processing capabilities, rather than a state machine, may perform functional checks that require signal processing such as Fourier Transforms. Thus, a first subset of the function irregularity checks is performed by the inner safety monitor 3 and a different, second subset is performed at the outer safety monitor 4, wherein the second subset comprises function irregularity checks that require signal processing. The first subset may comprise function irregularity checks that comprise a comparison of a measured value with a threshold. Thus, a layered monitoring function is provided. Further, the first subset may be performed by the sensors themselves and the inner safety monitor 3 may receive and collate the function irregularity signals generated by the sensors, as will be described in more detail below.

In one embodiment, the microcontroller or the outer safety monitor 4 is configured to perform a sanity check on the inner safety monitor 3 to ensure that the inner safety monitor 3 and the sensor 5a is performing as configured.

Figure 2:
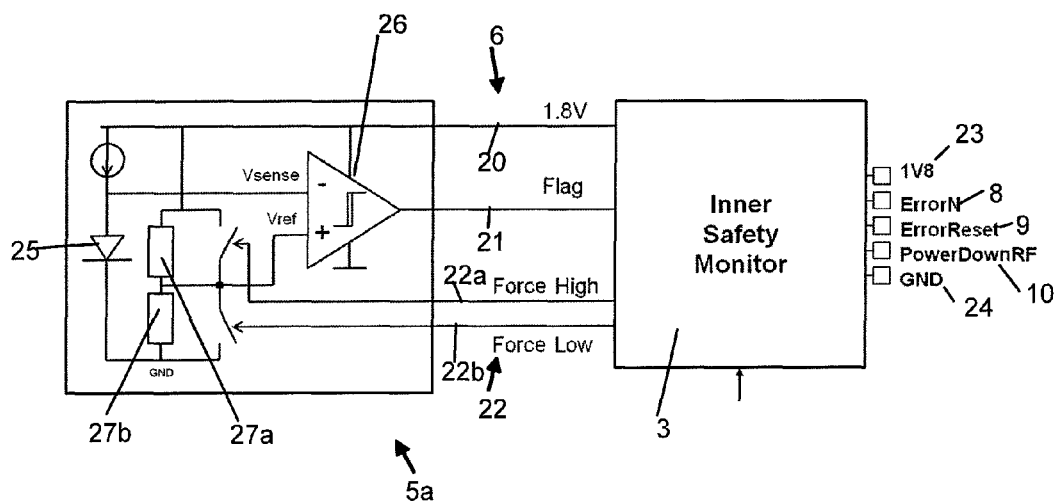
FIG. 2 shows an example temperature sensor.

FIG. 2 shows the connection between the inner safety monitor 3 and one of the sensors 5a-e. In this embodiment, sensor 5a comprises a temperature sensor for monitoring the temperature of a radar transmitter associated with the AEB system 1. It will be appreciated that the transmitter will have a range of operating temperatures in which it is approved to operate reliably. Thus, monitoring the temperature of the transmitter can ensure that it is operating within its approved operating conditions. The irregularity detecting arrangement thus comprises a temperature sensor 5a including a temperature sensing diode 25 adapted such that the voltage across the diode falls in response to rising temperature. A Schmitt-trigger 26 is provided to generate a flag condition when the voltage across the diode 25 is below a threshold value, which may be a lower safe operating limit of the transmitter. The threshold value is determined by the relative size of resistors 27a, 27b connected between the power supply line 20 and ground wherein a node between the resistors provides an input to one of the inputs of the Schmitt-trigger 26. The other input of the Schmitt trigger is provided by a node between the diode 25 and power supply line 20. The reset line 22 comprises two lines; a force high line 22a and a force low line 22b. These lines are used to reset the Schmitt-trigger 26 and also to trigger the Schmitt-trigger for self-testing purposes.

The Schmitt-trigger 26 is connected to the functionality line 21 and thus provides a signal indicative of a functional irregularity to the element 3 until the trigger 26 is reset. The functional irregularity is that the transmitter is experiencing a temperature outside its accepted operated conditions and could potentially be generating spurious RF signals.

As mentioned above, the signal on functionality line 21 is stored in a flip flop in the element 3 and logged in an SPI register. The reset line 22 comprises two lines; a force high line 22a and a force low line 22b. These lines are used to reset the Schmitt-trigger 26 and also to trigger the Schmitt-trigger for self-testing purposes. Upon reset, the Schmitt-trigger 26 stops providing the signal indicative of a functional irregularity to the element 3 on line 21. However, should the diode 25 continue to detect a temperature outside of the threshold, the trigger 26 will be triggered once again. The sensor 5a, by virtue of the Schmitt-trigger 26 and associated circuitry can determine when an irregularity occurs and report it to the element 3 with a two-state signal comprising irregularity present (signal output by Schmitt trigger) and irregularity not present (no signal output by Schmitt trigger).

Figure 3:
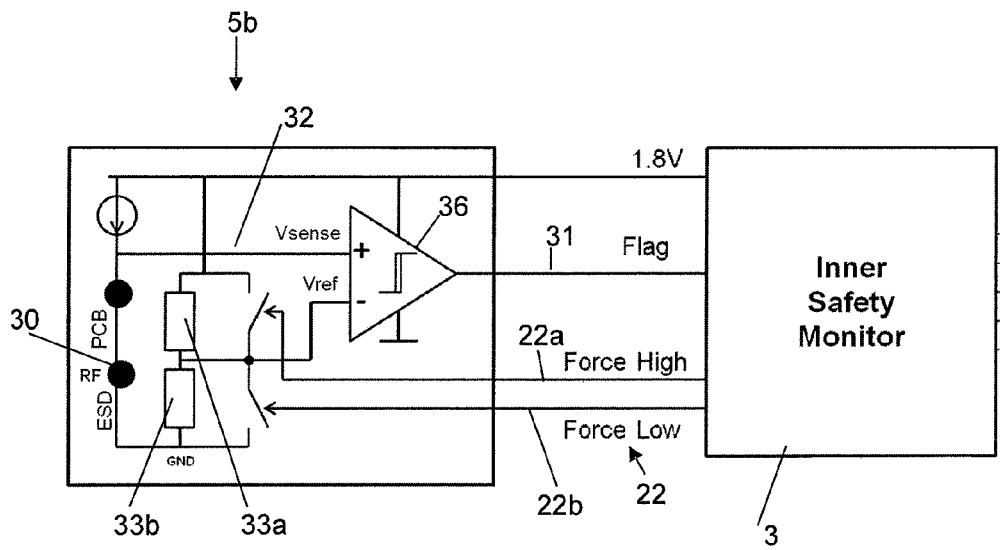
FIG. 3 shows an example RF ball break sensor.

FIG. 3 shows a further one of the sensors 5a-e and its interface with the inner safety monitor 3. In this embodiment, sensor 5b comprises a connection integrity sensor for monitoring if a connection and/or solder ball 30 in the RF transmitter and/or receiver associated with the AEB system 1 is broken. The sensor includes a Schmitt-trigger 36 connected to the functionality line 31 and thus provides a signal indicative of a functional irregularity to the element 3 until the trigger is reset. The irregularity comprises a connection problem in the RF transmitter or receiver that may affect their operation. When an RF solder ball 30 breaks, the DC voltage on Vsense line 32 rises towards 1.8V, which is the voltage present on the power supply line 20. On exceeding a threshold voltage value determined by resistive dividers 33a and 33b, the Schmitt-trigger comparator 36 raises a flag in the inner safety monitor 3 by way of a signal on functionality line 31.

Figure 4:
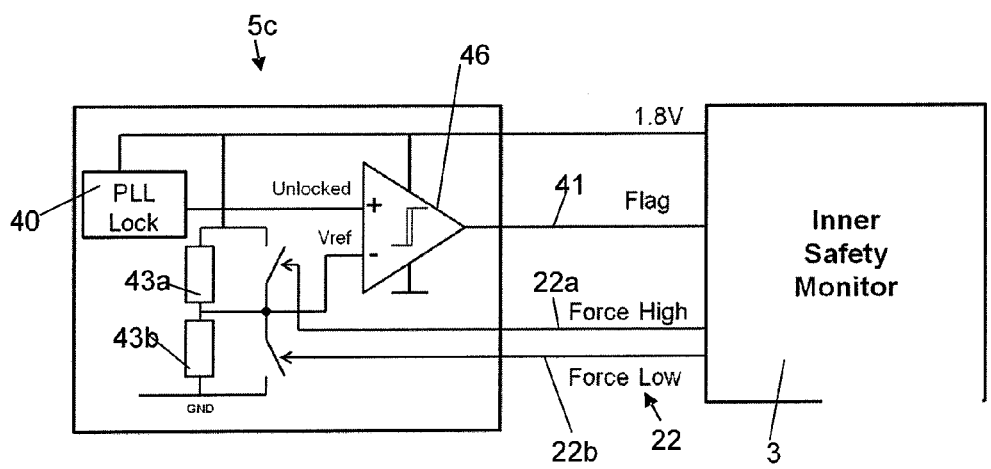
FIG. 4 shows an example phase lock loop out-of-lock sensor.

FIG. 4 shows a further one of the sensors 5a-e and its interface with the inner safety monitor 3. In this embodiment, sensor 5c comprises an oscillator lock sensor for monitoring if a phase locked loop 40 of the RF transmitter and/or receiver associated with the AEB system 1 is operating correctly. The sensor includes a Schmitt-trigger 46 connected to the functionality line 41 and thus provides a signal indicative of a functional irregularity to the element 3 until the trigger is reset. The irregularity comprises an out-of-lock condition in the phase-locked loop 40 chirp generator. Such an irregularity may occur by erroneous programming of chirp sweep parameters in relation to a programmed voltage controlled oscillator sub-band. Architectures suitable for detecting an out-of-lock condition will be known to those skilled in the art and therefore will not be described here. However, when a voltage indicative of an out-of-lock condition is supplied to one of the inputs of the Schmitt-trigger 36, a signal is supplied to the functionality line 41. The out-of-lock threshold value is determined by the relative size of resistors 43a, 43b connected between the power supply line 20 and ground wherein a node between the resistors provides an input to the other input of the Schmitt-trigger 26. The reset line 22 comprises two lines; a force high line 22a and a force low line 22b. These lines are used to reset the Schmitt-trigger 46 and also to trigger the Schmitt-trigger for self-testing purposes.

Figure 5:
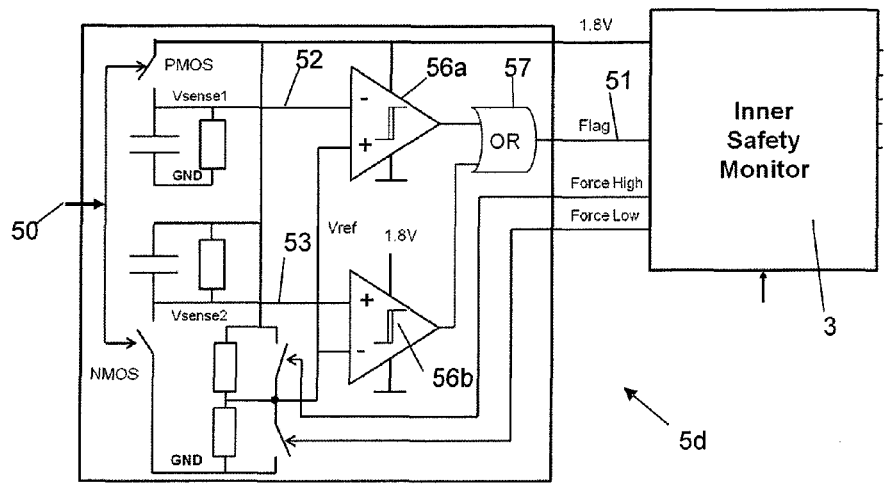
FIG. 5 shows an example clock monitor sensor.

FIG. 5 shows a further one of the sensors 5a-e and its interface with the inner safety monitor 3. In this embodiment, sensor 5d comprises a master clock monitor sensor for detecting the absence of a master clock signal 50. It is typical for AEB systems to include a 40 MHz master clock for operation. The sensor 5d includes two Schmitt-triggers 56a and 56b connected to the functionality line 51 via an OR gate 57 and thus provides a signal indicative of a functional irregularity to the inner safety monitor 3 if either of the Schmitt-triggers are triggered, until the triggers are reset. The irregularity comprises loss of the master clock signal.

In the event of a clock signal failure, the clock signal 50 will either stay permanently at logic high or at a logic low condition. In case the clock stays at a high logic level for more than a predefined time, a signal on "Vsense1" 52 is supplied to the first Schmitt-trigger 56a. Alternately if clock stays at logic low for more than a predetermined time a signal on "Vsense2" 53 is supplied to the second Schmitt-trigger 56b. The presence of a signal on Vsense1 or Vsense2 greater or less than a threshold value cause the associated Schmitt-trigger 56a, 56b to output a signal along functionality line 51 to the element 3 via the OR gate 57. Similarly to the other sensor embodiments, lines "Force High" 22a and "Force Low" 22b are used to reset the error condition in the Schmitt trigger and to perform self-check error injection.

Figure 6:
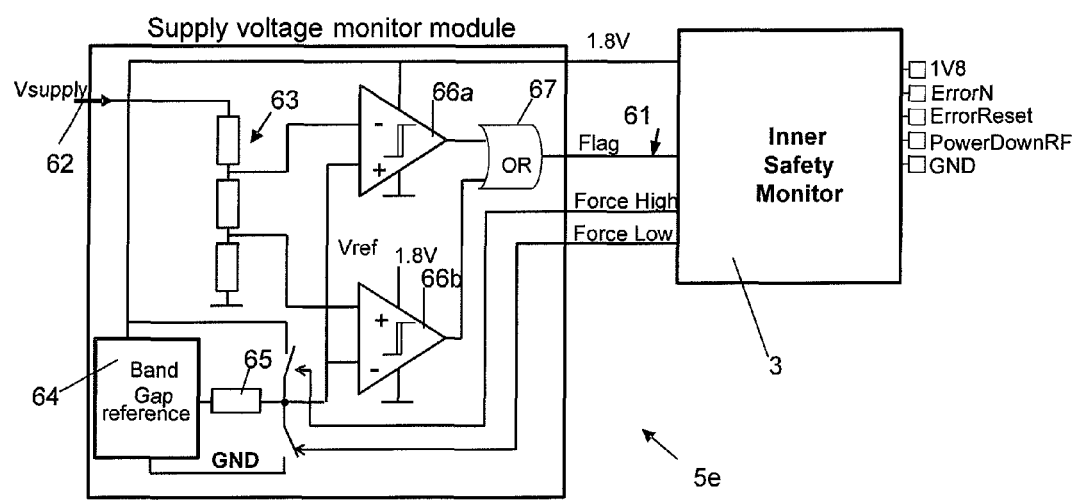
FIG. 6 shows an example voltage supply sensor.

FIG. 6 shows a further one of the sensors 5e and its interface with the inner safety monitor 3. In this embodiment, sensor 5e comprises a supply voltage sensor for detecting disruptions to the power supplied on the power supply line 62. The power supply line 62 may be configured to supply power to a RF transmitter associated with the AEB system 1. The sensor 5e includes two Schmitt-triggers 66a and 66b connected to the functionality line 61 via an OR gate 67 and thus provides a signal indicative of a functional irregularity to the element 3 if either of the Schmitt-triggers are triggered, until the triggers are reset. The irregularity comprises disruption to the power supply.

The voltage to be monitored is applied to a resistive divider 63 with three resistor elements. A reference voltage is derived from a band gap reference cell 64, which is applied to positive and negative inputs of the Schmitt-triggers 66a, 66b. The Schmitt-trigger whose positive input is connected to the reference voltage will detect negative glitches or a too low (stable) voltage level on voltage supply line 62; the other comparator will detect positive glitches or a too high voltage level on the voltage supply line 62. By virtue of the OR gate 67, triggering of either Schmitt-trigger will apply a signal along functionality line 61. Dimensioning of the restive divider 63 follows as a function of the specified threshold levels to be detected.

Similarly to the other sensor embodiments, lines "Force High" 22a and "Force Low" 22b are used to reset the error condition in the Schmitt triggers and to perform self-check error injection on a regular basis under control of the inner safety monitor 3. A protection resistor 65 connected to the output of the bandgap reference cell 64 is to protect it from short-circuit conditions when the Force High and Force Low signals are applied.

It will be appreciated that other sensors may be provided for monitoring conditions or processes of the system to be monitored. Sensors may be provided to monitor local oscillator power, phase noise level, chirp purity, transmit power condition, temperatures of the system, supply voltage conditions, RF connections and broken solder balls, properties of receiver components, such as noise level, amplitude and phase stability at different stages of the receiver circuitry, ADC clipping, mixer signals, power amplifier output levels, clock signals, function irregularity register (comprising a memory) integrity among others. The interface 5 between each sensor and the inner safety monitor 3 may comprise the same arrangement of power supply, functionality line and a reset line (which may comprises two reset sub lines). Thus, each sensor module may include a trigger supplied with a signal from irregularity determining circuitry to "measure" a parameter and, upon going beyond one or more thresholds, provide a persistent signal indicative of the occurrence of an irregularity in that parameter until a reset signal is applied to the module. Each sensor module is therefore capable of detecting the presence or absence of an irregularity, which it can report to the inner safety monitor 3.

In use, the AEB system 2 may be operational and the microcontroller of the outer safety monitor 4 may be processing signals to and from a RF transmitter/receiver assembly for providing an automatic emergency braking service. The microcontroller may also monitor the function of various components and/or processes in the system 2, such as noise levels in the signals received from the RF transmitter/receiver that forms a radar assembly, by monitoring parameters associated with those functions.

The inner safety monitor 3, which comprises a separate electronic component, possibly embodied on a separate integrated circuit, to the outer safety monitor 4, also monitors the function of other components and/or processing stages using the sensors 5*a-e*. The sensors, on detection of an irregularity, provide a high level signal on their functionality line 21, 31, 41, 51, 61 to inform the inner safety monitor 3. The signal received along the functionality line activates a flag in the inner safety monitor 3, which may be provided by a bistable component such as a flip flop 3*a*. A function irregularity register 3*b*, such as an SPI register, stores identifying detail of the sensor that sensed an irregularity. This may be achieved by mapping each sensor into a separate and unique binary position within the SPI register to be read by microcontroller of the outer safety monitor 4.

If the parameters sensed by the sensors 5*a-e* and reported to the second data processing system 4 via the inner safety monitor 3, or parameters assessed directly by the outer safety monitor 4 exceed predetermined thresholds, the outer safety monitor 4 may ignore signals from the radar assembly and/or deactivate the system 1 and may warn the user that the system is non-operational. With this data processing system set-up, undesirable and dangerous braking actions from a vehicle which would be generated as a consequence of a functional irregularity condition within the radar sensor may be avoided.

The activation of the flip flop flag causes a logic high level signal to be provided along function irregularity reporting line 8. Thus, the presence of the signal on line 8 indicates that an irregularity has been detected at any one of the sensors 5*a-e*. The function irregularity reporting line 8 acts as an interrupt to the microcontroller which may initiate an irregularity handling procedure. Alternatively, the microcontroller may intermittently read the logical state of function irregularity reporting line 8, for example each 40 ms.

The irregularity handling procedure may comprise generating a reset signal a predetermined number of times (each in response to the receipt of a distinct function warning signal on function irregularity reporting line 8) via the reset line 9. This may be done to check if the irregularity is persistent rather than spurious or only present temporarily. On receipt of the reset signal, the inner safety monitor 3 may refer to the function irregularity register to determine which of the sensors 5*a-e* triggered the error. It may then send a reset signal via reset line 22 to reset the Schmitt-trigger of that particular sensor. Alternatively, the inner safety monitor 3 may send a reset signal via all of the reset lines 22 to reset all of the triggers in all of the sensors 5*a-e*.

The irregularity handling procedure may comprise, possibly after issuing a reset signal a predetermined number of times, generating a RF power down signal via the RF power down line 10. The RF power down signal is received by the inner safety monitor 3 or a separate element within a front-end IC which hosts the inner safety monitor 3. The RF power down signals may be latched within a flip-flop and then be used in biasing cells generating biasing currents for power amplifiers and receiver functions of the AEB system.

Thus, the microcontroller receives notice that a function irregularity has occurred in any one or more of the sensors via the function irregularity reporting line 8. The microcontroller can discover details of the irregularity by requesting information from the function irregularity register using the serial peripheral interface. In this example, the microcontroller can discover which sensor has generated an irregularity condition. For example, if the temperature sensor associated with a given transmitter of the AEB system reports an error condition, the microcontroller may decide to program the output power level of that specific transmitter at a nominal lower level, such that its temperature will tend to decrease and come within the threshold after a period of time. In case the microcontroller, upon reading the register 3*b*, detects that the irregularity condition was generated by the PLL lock detector, then it may decide to choose another VCO sub-band to perform the frequency sweep operation, or to perform an open-loop assessment of all VCO sub-bands lower and upper frequency limits, such that the mapping of the desired frequency sweep into a given VCO sub-band can be error-free.

This arrangement is advantageous as the microcontroller does not need to select and read a plurality of different values from a plurality of different sensors. Instead, the sensors themselves can determine if a threshold has been exceeded and information from the sensors is collated at the inner safety monitor. This enables the microcontroller of the outer safety monitor 4 to interrogate the inner safety monitor 3 only when an irregularity is detected and flagged to it by the inner safety monitor 3. Function checks that require the signal processing capabilities of the microcontroller are performed by the microcontroller while the other checks may be handled by the inner safety monitor. Thus, data processing systeming is distributed over several components so as not to unduly burden the microcontroller with reading and interpreting sensor measurements.

Figure 7:
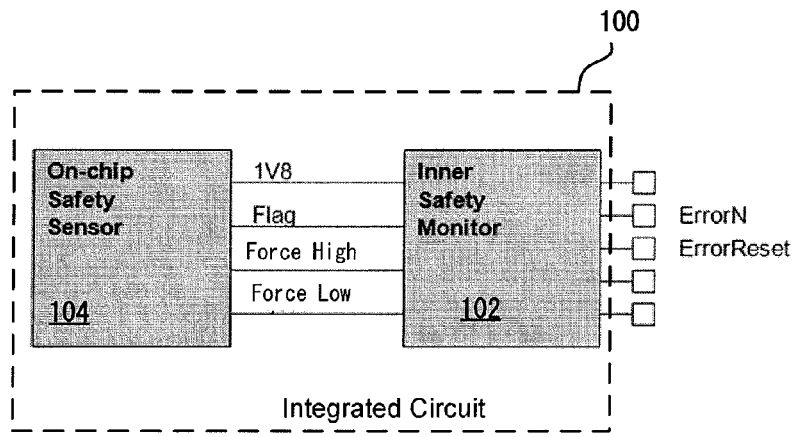
FIG. 7 illustrates an exemplary integrated circuit with a dedicated error indicator pin.

It should be noted that even though specific examples are being used herein, the embodiments described here may also be used in other applications. Accordingly, FIG. 7 illustrates an integrated circuit 100 that includes circuitry for a selected purpose. The integrated circuit 100 includes one or more internal sensors or error check modules 104 to routinely check other modules inside the integrated circuit 100. The integrated circuit 100 also includes an inner safety module/monitor 102 (which may be the same as innter safety monitor 3 of FIG. 1) that is coupled to one or more internal sensors or error check modules 104. In some embodiments where there is only one sensor or error check module, the inner safety module and error check module may be combined into one module.

The integrated circuit 100 includes a dedicated error indicator pin ErrorN. The integrated circuit 100 may also include a dedicated error reset ErrorReset pin. The error indicator pin ErrorN is not used for any other purpose but to indicate functional status (either error or no error) of the integrated circuit 100. If the internal sensor or error module 104 determines that internal functional modules (not shown) of the integrated circuit 100 are not functioning as expected, the status of the error indicator pin ErrorN is set to low to indicate an error. The error reset pin ErrorReset may be used by an external system (not shown) to reset the error. Note that in these examples, a low state is being used to indicate an error condition merely as an example. In some embodiments, the error indicator pin ErrorN status may be set to high to indicate an error condition. In one embodiment, when an error is detected or reported by the inner safety monitor 3, the ErrorN pin stays low even when the error condition has disappear. The external system, however, may use ErrorReset pin either at regular intervals or when it is necessary to determine if an error persists to reset the error. If the error persists, the status of the ErrorN pin will be set to low again after the error is reset via the ErrorReset pin. In another embodiment, the inner safety monitor 3 may reset the error automatically when the error condition dispears.

In one embodiment, the status of the error indicator pin ErrorN stays low until the error is reset by an external system using the error reset pin ResetError even after the inner safety module 102 determines that the internal functional modules are working properly. In other embodiments, when the inner safety module 102 determines that the internal functional modules are working properly, the status of the error indicator pin ErrorN is set to high even in cases where an external system does not reset the error using the error reset pin ResetError.

Figure 8:
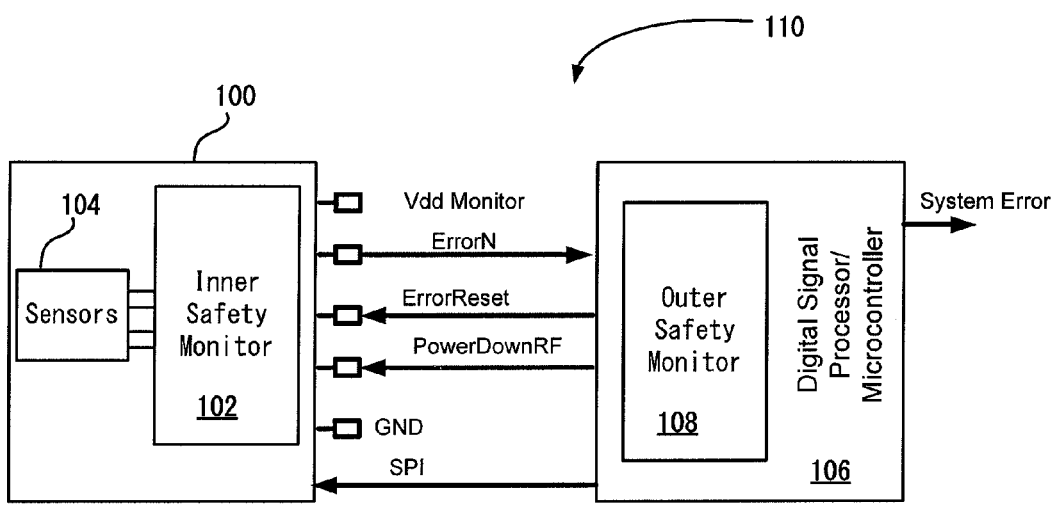
FIG. 8 is a schematic diagram of an exemplary system illustrating the use of the integrated circuit with a dedicated error indicator pin.

FIG. 8 illustrates a use of the error detection and reporting mechanism in a system 110 that includes an external system, e.g., a microcontroller 106 in this example. The system 110 includes the integrated circuit 100 including the error indicator pin ErrorN and the error reset pin ResetError. The error indicator pin ErrorN and the error reset pin ResetError are coupled to the microcontroller 106. In one embodiment the microcontroller 106 includes an outer safety monitor 108. The outer safety monitor 108 acts as a master monitor and manages error conditions flagged by the inner safety monitor 102. The integrated circuit 100 may also include yet another dedicated pin that can be used the microcontroller 106 to instruct the integrated circuit 100 to perform a predefined operation when the microcontroller 106 sets the status of the pin high (or low according to specific system design). In this example, this third dedicated pin is Power-Down-RF, which in the context of a radar system, can be used by the microcontroller 106 to instruct the integrated circuit 100 to power down RF processing or transmission. However, in other applications, a different operation in accordance with a specific system design, may be triggered via this third dedicated pin. In one embodiment, the outer safety monitor 108 may be configured to perform additional safety checks prior to instructing the inner safety monitor 102 via the Power-Down-RF pin.

In one embodiment, the correct functioning of the inner safety monitor 102 and the sensor 104 is routinely verified to ensure the components involved in error reporting are in good health i.e., functioning as designed. The microcontroller 106 or the outer safety monitor 108 may use a fault injection utility to create fault conditions and monitor if the state of the ErrorN pin changes accordingly.

Figure 9:
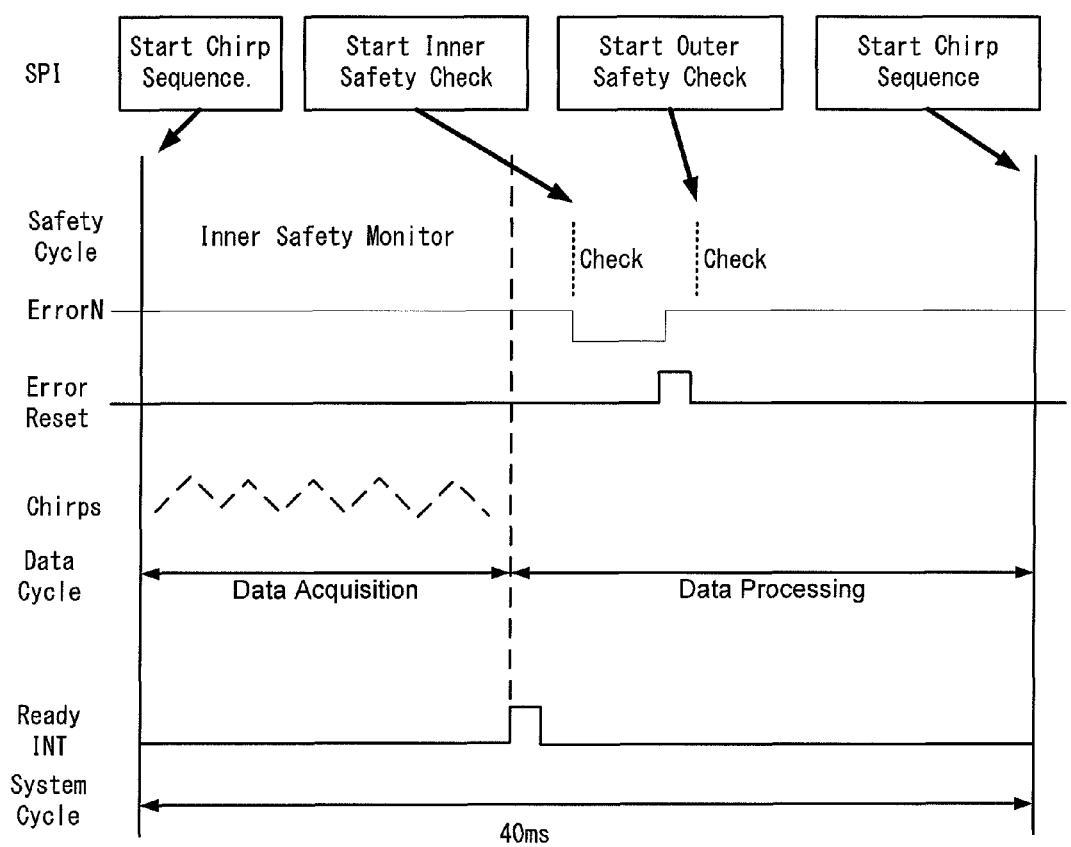
FIG. 9 illustrates an exemplary functional safety cycle in a radar system.

FIG. 9 illustrates a functional safety operation integrated in an exemplary Radar system operations. As noted above, the use of the Radar system is merely exemplary. The embodiments described herein may also be practiced in other system without deviating from the disclosure in this document.

The exemplary Radar system operations include a Radar system cycle that contains two stages of data handling: data acquisition and data processing. In the data acquisition stage the Radar frequency ramps are generated, transmitted, received and digitized. In the data processing stage the digitized data are analysed and conclusions are drawn about detected objects. In one example, the Radar Cycle takes approximately 40 ms to finish, and is repeated over and over. Hence, in this example, the "image" seen by the Radar is typically refreshed 25 times per second.

According to one or more embodiments, a safety check cycle is added to the data cycle. Accordingly during data acquisition, the function blocks (inside the integrated circuit 100) that generate, transmit, receive and digitize the signals are monitored with on-chip sensors 104. In case of a failure in one of the function blocks, the associated sensor flags the error to the Inner Safety Monitor 102, by setting the "flag" line high. On this event the inner safety monitor 102 signals to the connected microcontroller 106, by setting the "ErrorN" pin low (or high in other embodiments depending on the system design), generating an interrupt. The interrupt causes the microcontroller 106 to execute a pre-programmed software module. If all functional blocks perform well, the "ErrorN" pin stays high. The data acquisition stage is typically initiated by a command given by the microcontroller 106 through the SPI interface.

During the data processing stage the correct functioning of the "Flag" lines as well as the "ErrorN" pin and the mechanisms behind them are verified with an inner safety check. Typically the inner safety check is initiated with a SPI command by the microcontroller 106. In the inner safety check, the fault Inject lines (or force low lines) of all on-chip sensors 104 are made high by the inner safety monitor 102, so that the error "Flag" lines all should go high. If all error "Flag" lines are high then the "ErrorN" pin is put down. If one or more "Flag" line fails to go down (e.g., low), the "ErrorN" pin is not set to low. Note that the inner safety check is not tied to a particular timing in that the inner safety check may be performed at any time during the data processing cycle.

During the data processing stage the outer safety check is initiated through an SPI command. The outer safety check verifies the correct functioning of the receive signal path, through, in one example, the Fast Fourier Transform (FFT) analysis. A defined offset signal using a signal generator & injector is put through the receive channel, and the microcontroller 106 verifies whether the measured offset equals the defined offset signal. The outer safety check may be performed at any time during the data processing cycle.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. An integrated circuit, comprising:
   at least one error sensor having a fault injection line, the error sensor and configured to indicate an error condition in response to a sensed error condition and in response to the fault injection line; and
   an error monitor circuit coupled to a dedicated error indicator pin, the error monitor circuit configured to:
      set the status of the dedicated error indicator pin in response to an error condition indicated by the at least one error sensor; and
      perform an inner safety check by:
         setting the fault injection line; and
         verifying that each error sensor of the at least one error sensor indicated an condition in response to the fault injection line.

2. The integrated circuit of claim 1, wherein the error monitor circuit is configured to reset the dedicated error indicator pin in response to a dedicate error reset pin coupled to the inner error monitor circuit.

3. The integrated circuit of claim 1, wherein the error monitor circuit is configured to power down radio frequency communications in response to a dedicated operation pin.

4. The integrated circuit of claim 3, further including a processing circuit that includes a data collection interface that is configured to receive radar data from a radar sensor that is monitored by the at least one error sensor for the error condition, and to process the received radar data.

5. The integrated circuit of claim 4, wherein the radio frequency communications provide the radar data to the data collection interface.

6. The integrated circuit of claim 2, wherein the integrated circuit is configured to continue to keep the status of the dedicated error indicator pin to indicate an error even when the error no longer persists until an external system resets the error via the dedicated error reset pin.

7. A radar data processing system, comprising:
   a microcontroller; and
   a data receiver-transmitter integrated circuit coupled to the microcontroller, the data receiver-transmitter integrated circuit including:
   at least one sensor,
   a dedicated error indicator pin, and
   an inner safety monitor; and wherein the microcontroller includes an outer safety monitor, the inner safety monitor configured to receive and collate sensor data from the at least one sensor and send, through the dedicated error indicator pin, a function warning signal to the outer safety monitor when or in response to the sensor data from the sensor indicating an error condition.

8. The radar data processing system of claim 7, wherein the function warning signal comprises an interrupt, wherein the microcontroller is configured to execute an operation upon receiving the interrupt.

9. The radar data processing system of claim 7, wherein the inner safety monitor is dedicated to monitoring for functional irregularities and the outer safety monitor is configured to additionally process data for providing a service of the radar data processing system.

10. The radar data processing system of claim 7, wherein the inner safety monitor stores identifying details of function irregularities in a memory.

11. The radar data processing system of claim 7, further including a fault injection line, and wherein the at least one sensor is connected to the fault injection line and configured to generate sensor data indicating an error condition in response to the fault injection line and in response to an error condition of the sensor, and wherein the at least one sensor comprises at least one or more of:
   i) a temperature sensor;
   ii) a RF connection break;
   iii) an oscillator fault detector;
   iv) clock fault sensor; and
   v) voltage level sensor.

12. The radar data processing system of claim 7, wherein the inner safety monitor comprises a state machine.

13. The radar data processing system of claim 7, wherein each sensor includes an irregularity detecting arrangement including a trigger having an irregularity detected state and a no irregularity detected state, the trigger configured to adopt the irregularity detected state when the arrangement detects that a measurement value is outside of a predetermined threshold.

14. The radar data processing system of claim 13, wherein the sensor data comprises a signal that indicates the state of the irregularity detecting arrangement.

15. The radar data processing system of claim 7, wherein in response to receiving a function warning signal, the outer safety monitor is configured to selectively provide a reset signal to said inner safety monitor and, in response to receiving the reset signal, the inner safety monitor is configured to reset the sensor that caused it to generate the function warning signal.

16. The radar data processing system of claim 7, wherein in response to receiving a function warning signal, the outer safety monitor is configured to selectively provide a power down signal to said inner safety monitor and, in response to receiving the power down signal, the inner safety monitor is configured to provide instructions to power down the system.

17. The radar data processing system of claim 7, wherein communication between the inner safety monitor and outer safety monitor is provided by three hardware lines comprising:
- a function irregularity reporting line for providing the function warning signal to the outer safety monitor;
- a reset sensor line for providing a reset signal to the inner safety monitor for resetting a detected function irregularity; and
- a power down line for providing a power down signal to the inner safety monitor to deactivate the system.

18. The radar data processing system of claim 7, wherein the data receiver-transmitter integrated circuit receives a power supply that is different from a power supply received by the microcontroller.

19. The radar data processing system of claim 7, wherein the outer safety monitor is configured to selectively send an irregularity enquiry request to said inner safety monitor and, in response to said request, the inner safety monitor is configured to report the status of one or more of the sensors.

20. The radar data processing system of claim 7, wherein the outer safety monitor is configured to performed a sanity check on the inner safety monitor to ensure that the inner safety module and the sensor are healthy.

* * * * *